US006788602B2

(12) United States Patent
Huang et al.

(10) Patent No.: US 6,788,602 B2
(45) Date of Patent: Sep. 7, 2004

(54) MEMORY DEVICE AND OPERATION THEREOF

(75) Inventors: Jen-Ren Huang, Hsinchu (TW); Ming-Hung Chou, Hsinchu (TW); Hsin-Chien Chen, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 39 days.

(21) Appl. No.: 10/214,770

(22) Filed: Aug. 9, 2002

(65) Prior Publication Data

US 2004/0027864 A1 Feb. 12, 2004

(51) Int. Cl.[7] .................................... G11C 11/00
(52) U.S. Cl. ...................... 365/210; 365/218; 365/63
(58) Field of Search ........................ 365/210, 218, 365/63

(56) References Cited

U.S. PATENT DOCUMENTS 5,297,077 A * 3/1994 Imai et al. .................. 365/145
5,402,380 A * 3/1995 Kumakura et al. .... 365/185.08
5,463,587 A * 10/1995 Maruyama ............. 365/185.22
5,566,386 A * 10/1996 Kumakura et al. ......... 365/226
5,592,427 A * 1/1997 Kumakura et al. ......... 365/205
5,659,503 A * 8/1997 Sudo et al. .............. 365/185.2
6,094,371 A * 7/2000 Fukuda ....................... 365/145
6,111,777 A * 8/2000 Ogiwara et al. ............ 365/145
6,198,681 B1 3/2001 Forbes ....................... 365/205
6,574,133 B2 * 6/2003 Takashima .................. 365/145
2002/0050616 A1 * 5/2002 Kurosaki .................... 257/357

FOREIGN PATENT DOCUMENTS

JP 406223587 A * 8/1994 ........... G11C/16/06
JP 11134881 A * 5/1999 ........... G11C/16/02

* cited by examiner

*Primary Examiner*—Viet Q. Nguyen
(74) *Attorney, Agent, or Firm*—Finnegan, Henderson, Farabow, Garrett & Dunner, L.L.P.

(57) ABSTRACT

A semiconductor memory device is provided, including one or more bit lines, one or more word lines, and a dummy word line, which is coupled to a positive bias. A memory cell and dummy cell are coupled to a bit line and may be coupled to a word line and dummy word line respectively. Coupling the dummy word line to a positive bias at least during an erase operation prevents the dummy cells from being over-erased, which occurs when the dummy word line is coupled to ground.

17 Claims, 4 Drawing Sheets

200
230m
$230_2$
$230_1$
$270_1$
280
290
250
CONTROL LOGIC
$260_{11}$
$240_1$
ROW DECODER
220
$275_1$
295
$240_n$
CONTROL LOGIC
SENSE AMPLIFIER / COLUMN DECODER CIRCUIT
255
285
210

MEMORY DEVICE AND OPERATION THEREOF

FIELD OF THE INVENTION

The present invention relates generally to a memory device and, more particularly, to a semiconductor memory device and method for preventing dummy cells coupled to dummy word lines from over-erasing.

BACKGROUND OF THE INVENTION

A memory device conventionally may include a transistor that serves as a memory cell coupled to a word line and a bit line. Multiple memory cells may form a memory array, which generally includes the memory cells coupled to a grid of word lines and bit lines. During formation of the memory device, the memory lines (word lines and bit lines) at the edges of the device are often etched partially or completely, rendering unusable the memory cells to which they are connected. To protect a usable memory cell from damage, the memory device may include, at an edge, a dummy word line (i.e., a word line not used for programming). The dummy word line may not be coupled to a word line driver, thus each memory cell connected to the dummy word line will not be used to store data—i.e., it is a dummy cell. Consequently, etching of the dummy word line during formation will not result in loss of usable memory.

Conventionally, the dummy word line at the edge is continuously coupled to ground. Thus, regardless of the voltage applied to a corresponding bit line (whether a program or erase voltage), the dummy cell is in a constant state of being weakly erased, which leads to over-erasure of the dummy cell. This over-erasure results in current leakage along the bit lines coupled to the over-erased dummy cells during read operations of usable memory cells.

FIG. 1 demonstrates the relationship between current leakage of a bit line and the threshold voltage of a dummy cell coupled to a dummy word line ("VT") as compared to the number of cycles (i.e., program and erase operations) performed when the dummy word line is coupled to ground. Line 110 represents the current leakage of a bit line coupled to a dummy cell ("BD leakage") in relation to the number of cycles, and line 120 represents the threshold voltage needed to turn on a dummy cell in relation to the number of cycles.

A memory device with the characteristics illustrated in FIG. 1 includes a dummy word line that is set to approximately 0 volts during program and erase operations. During a program operation, the drain voltage applied to the bit line is set to approximately 7 volts, the source voltage is set to approximately 0 volts, the substrate voltage is set to approximately 0 volts, and the voltage is applied for roughly 2 $\mu$s. During an erase operation, the drain voltage applied to the bit line is set to approximately 7.5 volts, the source voltage is allowed to float, the substrate voltage is set to approximately 0 volts, and the voltage is applied for roughly 40 ms.

As line 110 illustrates, the initial BD leakage is 0.000782 $\mu$A, whereas after 30,000 programming cycles, the BD leakage is 0.281 $\mu$A. That is, after 30,000 programming cycles, the current leakage of the bit line coupled to a dummy cell increases by 0.280218 $\mu$A. As line 120 illustrates, the initial threshold voltage is 1.131 volts, whereas after 30,000 programming cycles, the threshold voltage decreases by 0.2122 volts to 0.9188 volts.

Further, the semiconductor memory device may be tested, as is commonly done, for leakage by baking it for 4 hours at 150° C. after 30,000 cycles. If this is done, the current leakage will be 0.473 $\mu$A, for an increase of 0.472218 $\mu$A from the initial state, and the threshold voltage will drop to 0.733 volts for a drop of 0.398 volts from the initial state.

What is desired is a system and method that reduces the amount of leakage along the bit line that results from over-erasing a dummy cell while avoiding loss of usable memory cells that may result during formation.

SUMMARY OF THE INVENTION

Systems and methods consistent with the present invention satisfy the above need by providing a semiconductor memory device that reduces the current leakage along the bit line by coupling a dummy word line at the edge of a memory device to a positive power source.

In one embodiment consistent with the invention, a semiconductor memory device comprises a memory cell, a dummy word line coupled to the memory cell, a control logic for supplying a positive bias to the dummy word line during an erase operation, and at least one bit line coupled to the memory cell.

In another embodiment consistent with the invention, a semiconductor memory array comprises a memory cell, at least one bit line arranged in a first direction and coupled to the memory cell; and at least one dummy word line arranged in a second direction perpendicular to the at least one bit line and coupled to the memory cell, wherein a positive bias is selectively supplied to the at least one dummy word line at least during erase operation.

Additional features and advantages consistent with the invention will be set forth in part in the description that follows, and in part will be obvious from the description, or may be learned by practice of the invention. The features and advantages consistent with the invention will be realized and attained by means of the elements and combinations particularly pointed out in the appended claims.

BRIEF DESCRIPTION OF THE DRAWINGS

It is to be understood that both the foregoing general description and the following detailed description are exemplary and explanatory only and are not restrictive of the invention, as claimed. The accompanying drawings, which are incorporated in and constitute a part of this specification, illustrate exemplary embodiments of the invention and together with the description, serve to explain the principles of the invention. In the drawings:

DESCRIPTION OF THE EMBODIMENTS

Reference will now be made in detail to exemplary embodiments consistent with the invention, an example of which is illustrated in the accompanying drawings. Wherever possible, the same reference numbers will be used throughout the drawings to refer to the same or like parts.

Figure 1:
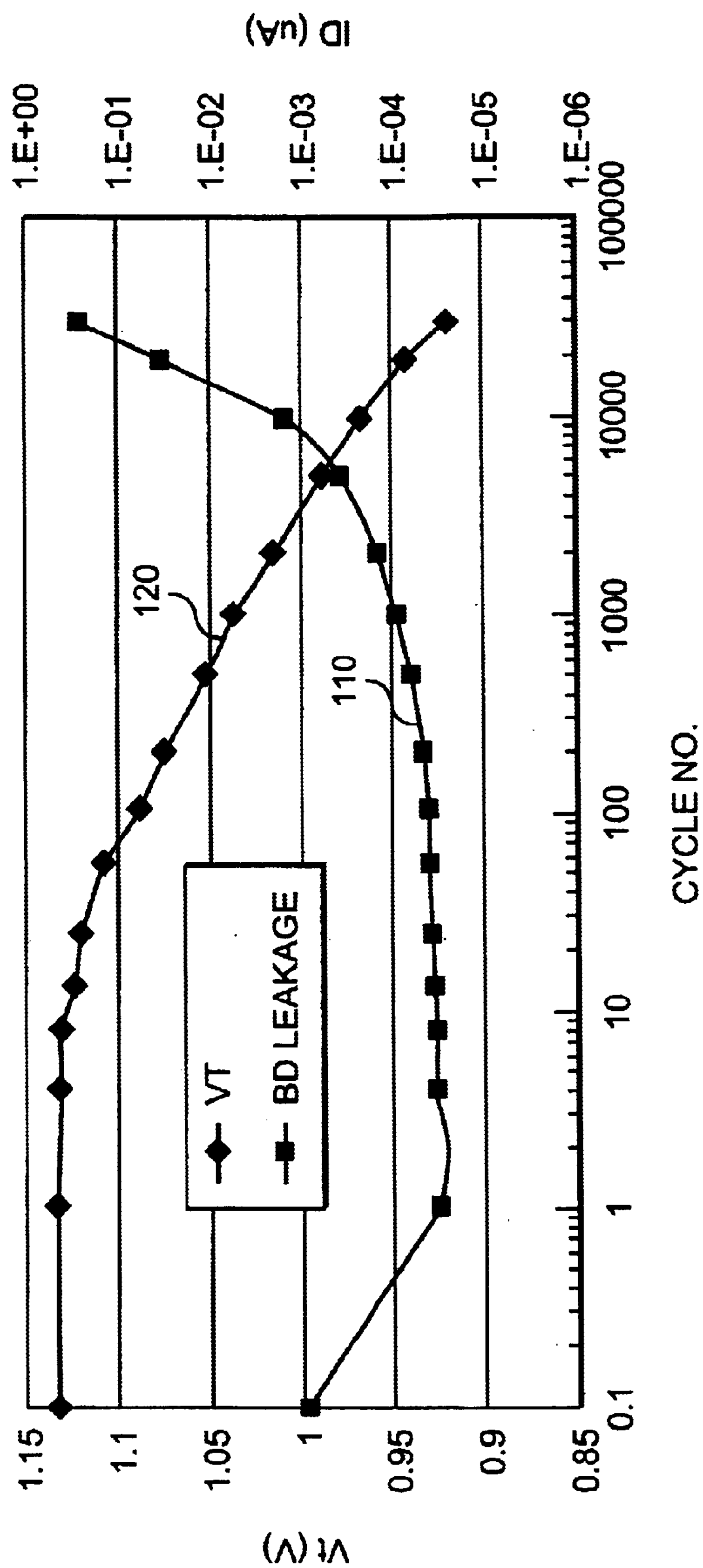
FIG. 1 is a graph demonstrating current leakage and threshold voltage of a dummy cell coupled to a dummy word line relative to the number of programming cycles in a conventional semiconductor memory device.
Figure 2:
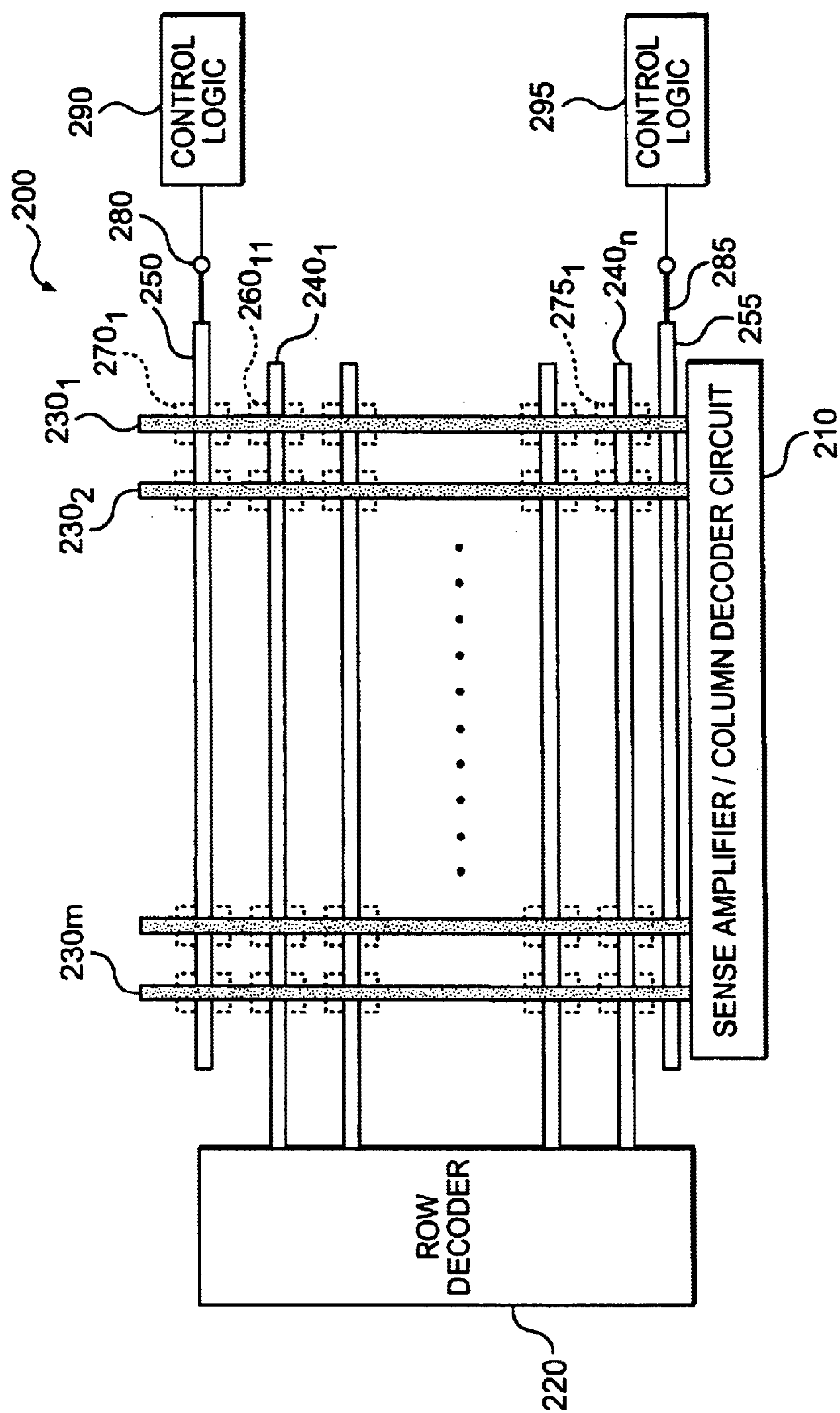
FIG. 2 is a block diagram of an embodiment consistent with the present invention.

FIG. 2 is a block diagram of a semiconductor memory device 200 consistent with one embodiment of the present invention. Semiconductor memory device 200 comprises a sense amplifier and column decoder 210, a row decoder 220, a bit line $\mathbf{230}_j$ (where, j=1, 2, . . . , m), a word line $\mathbf{240}_k$ (where, k=1, 2, . . . , n), and dummy word lines 250 and 255. Semiconductor memory device 200 further comprises memory cells $\mathbf{260}_{jk}$, dummy cells $\mathbf{270}_j$ and $\mathbf{275}_j$, and positive biases 280 and 285, which may be coupled to control logics 290 and 295, respectively.

The components of semiconductor memory device 200 may be suitably arranged as follows. Bit line $\mathbf{230}_j$ is arranged in a first direction and is coupled at one end to sense amplifier/column decoder circuit 210. Word line $\mathbf{240}_k$, which is coupled to row decoder 220 at one end, is arranged approximately perpendicular to bit line $\mathbf{230}_j$. Memory cell $\mathbf{260}_{jk}$ may be a transistor coupled to word line $\mathbf{240}_k$ and bit line $\mathbf{230}_j$. One skilled in the art will recognize that although a transistor is used for purposes of explanation, other structures may be appropriately used. Dummy word lines 250 and 255 are arranged at the outer edge of a memory array and are parallel to word line $\mathbf{240}_k$ and perpendicular to bit line $\mathbf{230}_j$. Dummy word lines 250 and 255 are coupled between positive biases at each end; however, one of the positive biases could be 0 volts during programming operations. Positive biases 280 and 285 may be further coupled to control logics 290 and 295, respectively, which control the bias applied to dummy word lines 250 and 255, for example, according to whether semiconductor memory device 200 is in program or erase operation. One skilled in the art will recognize that control logics 290 and 295 may be directly coupled to dummy word lines 250 and 255, respectively, to directly supply a positive bias. In addition, dummy cells $\mathbf{270}_j$ and $\mathbf{275}_j$ may be transistors coupled to dummy word lines 250 and 255, respectively, and bit line $\mathbf{230}_j$. Again one skilled in the art will recognize that although a transistor is used for purposes of explanation, other structures may be appropriately used.

One skilled in the art will further recognize that although dummy word lines 250 and 255 are shown as coupled to separate positive biases 280 and 285, which are further coupled to separate control logics 290 and 295, dummy word lines 250 and 255 may be coupled to a single positive bias, and positive biases 280 and 285 or the single positive bias may be further coupled to a single control logic. Similarly, an embodiment may include multiple dummy word lines arranged at the outer edge of the memory array coupled to one or more positive biases, which may be further coupled to one or more control logics. Alternatively, an embodiment consistent with the present invention may include a single dummy word line.

One embodiment consistent with the present invention may further include a dummy bit line (not shown) located on an outer edge of the memory array, parallel to bit line $\mathbf{230}_j$. If present, dummy bit line may or may not be coupled to a memory cell (e.g., a transistor) also coupled to dummy word lines 250 and 255. One of ordinary skill in the art will recognize that memory cell $\mathbf{260}_{jk}$, and dummy cells $\mathbf{270}_j$ and $\mathbf{275}_j$ may be, for example, floating-gate cells, SONOS (Polysilicon-Oxide/Nitride/Oxide-Silicon) nonvolatile cells, etc.

Operation of semiconductor memory device 200 may be implemented as follows. Sense amplifier and column decoder 210 selects a column (i.e., selected bit line $\mathbf{230}_j$) of memory device 200 for programming. Although sense amplifier and column decoder 210 is represented as a single circuit, one skilled in the art will recognize that a sense amplifier and a column decoder may be implemented by separate circuitry. Row decoder 220 selects a row (i.e., selected word line $\mathbf{240}_k$) for programming memory cell $\mathbf{260}_{jk}$. Memory cell $\mathbf{260}_{jk}$ corresponds to selected bit line $\mathbf{230}_j$ and selected word line $\mathbf{240}_k$. Positive biases 280 and 285 are continuously applied to dummy word lines 250 and 255, at least during an erase operation, as may be determined by control logics 290 and 295. In one embodiment, positive biases 280 and 285 are greater than 2.5 volts during an erase operation, but each may be any value appropriate to reduce or prevent bit line leakage and need not equal the same value. Consequently, dummy cells $\mathbf{270}_j$ and $\mathbf{275}_j$ are only weakly programmed.

A first voltage is applied to selected bit line $\mathbf{230}_j$ by sense amplifier and column decoder 210, which selects a column of memory cells for programming. A second voltage is applied to selected word line $\mathbf{240}_k$, which selects corresponding memory cell $\mathbf{260}_{jk}$ to be programmed. The amount of the second voltage in relation to the first voltage determines whether the operation is a program or erase operation. If the voltage applied to selected word line $\mathbf{240}_k$ is less than the voltage applied to selected bit line $\mathbf{230}_j$ (e.g., the voltage applied to selected word line $\mathbf{240}_k$ is −3 volts and the voltage applied to selected bit line $\mathbf{230}_j$ is 7.5 volts), memory cell $\mathbf{260}_{jk}$ will be erased. Alternatively, if the voltage applied to selected word line $\mathbf{240}_k$ is greater than the voltage applied to selected bit line $\mathbf{230}_j$ (e.g., the voltage applied to selected word line $\mathbf{240}_k$ is 11.5 volts and the voltage applied to selected bit line $\mathbf{230}_j$ is 5 volts), data will be programmed to memory cell $\mathbf{260}_{jk}$. In both of these examples, positive biases 280 and 285 supply a positive voltage (e.g., 2.6 volts) to dummy word lines 250 and 255 such that dummy cells $\mathbf{270}_j$ and $\mathbf{275}_j$ corresponding to selected bit line $\mathbf{230}_j$, are constantly weakly programmed.

Alternatively, control logics 290 and 295 may be coupled to positive biases 280 and 285 to ensure that during a program operation, a bias greater than or equal to 0 volts is supplied to dummy word lines 250 and 255, or during an erase operation, a bias greater than 0 volts is supplied. That is, control logics 290 and 295 determine whether a program or erase operation is being performed on corresponding memory cell $\mathbf{260}_{jk}$.

Figure 3:
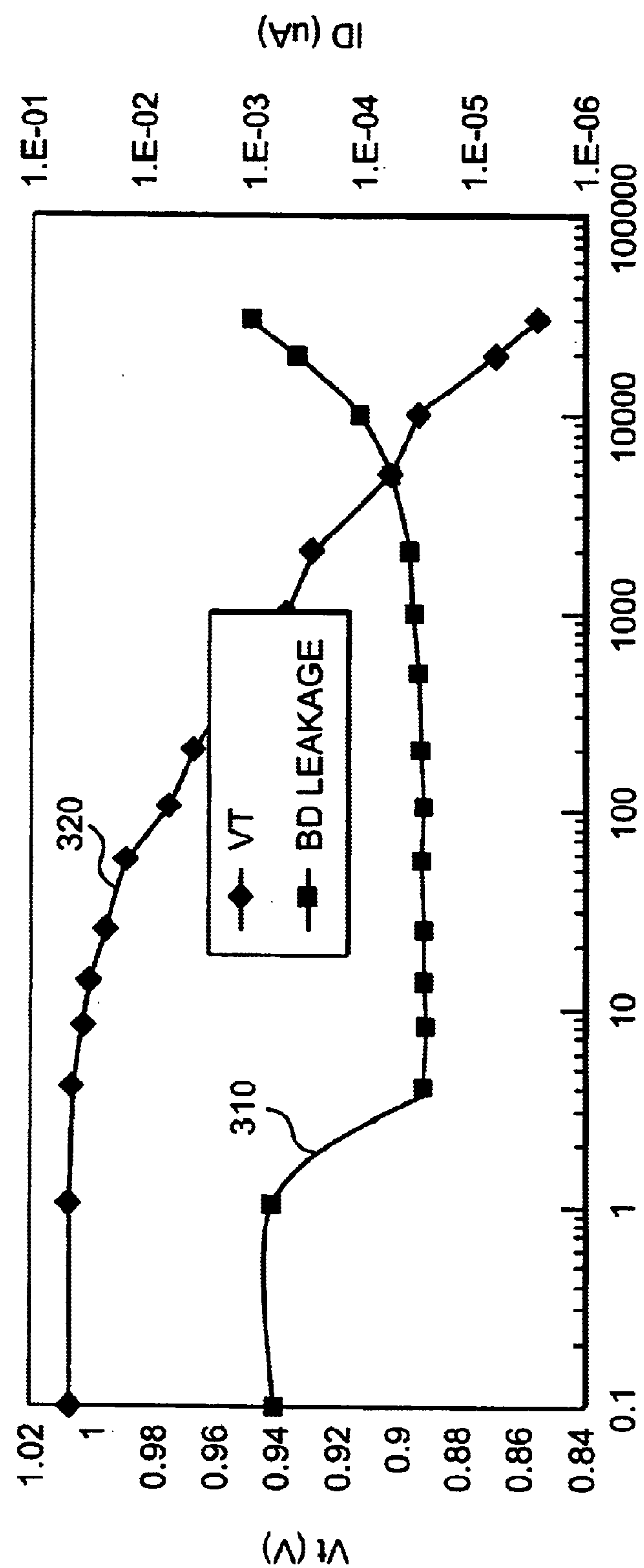
FIG. 3 is a graph demonstrating the current leakage and the threshold voltage of a dummy cell coupled to a dummy word line relative to the number of cycles in an embodiment consistent with the present invention.

Referring to FIG. 3, there is shown a graph that depicts the current leakage and the threshold voltage of a memory cell coupled to a dummy word line relative to the number of programming cycles in a memory device consistent with an embodiment of the present invention. In this case, with reference to dummy word lines 250 and 255, positive biases 280 and 285 supplied to dummy word lines 250 and 255, respectively, are set to approximately 0 volts during programming operations and to 2.6 volts during erase operations. During programming operations, the drain voltage applied to the bit line is set to approximately 7 volts, the source voltage is set to approximately 0 volts, the substrate voltage is set to approximately 0 volts, and the voltage is applied for roughly 2 $\mu$s. During erase operation, the drain voltage applied to the bit line is set to approximately 7.5 volts, the source voltage is allowed to float, the substrate voltage is set to approximately 0 volts, and the voltage is applied for roughly 40 ms.

As line 310 illustrates, the initial BD leakage is 0.000651 $\mu$A, whereas after 30,000 programming cycles, the BD leakage is 0.00109 $\mu$A. That is, after 30,000 programming cycles, the current leakage of dummy word line 250 increases by 0.000439 μA, rather than an increase of about 0.28 μA as in the prior art. As line 320 illustrates, the initial threshold voltage is 1.006 volts, whereas after 30,000 programming cycles, the threshold voltage decreases by 0.1508 volts to 0.8552 volts, rather than a decrease of about 0.21 volts as in the prior art.

Further, after testing semiconductor memory device 200 for leakage after 30,000 cycles by baking for 4 hours at 150° C., the current leakage will be 0.0000382 μA, for a decrease of 0.000613 μA from the initial state, rather than an increase of about 0.47 μA as in the prior art, and the threshold voltage will drop to 0.7307 volts, down 0.2753 volts from the initial state, rather than a decrease of 0.398 volts as in the prior art.

Figure 4:
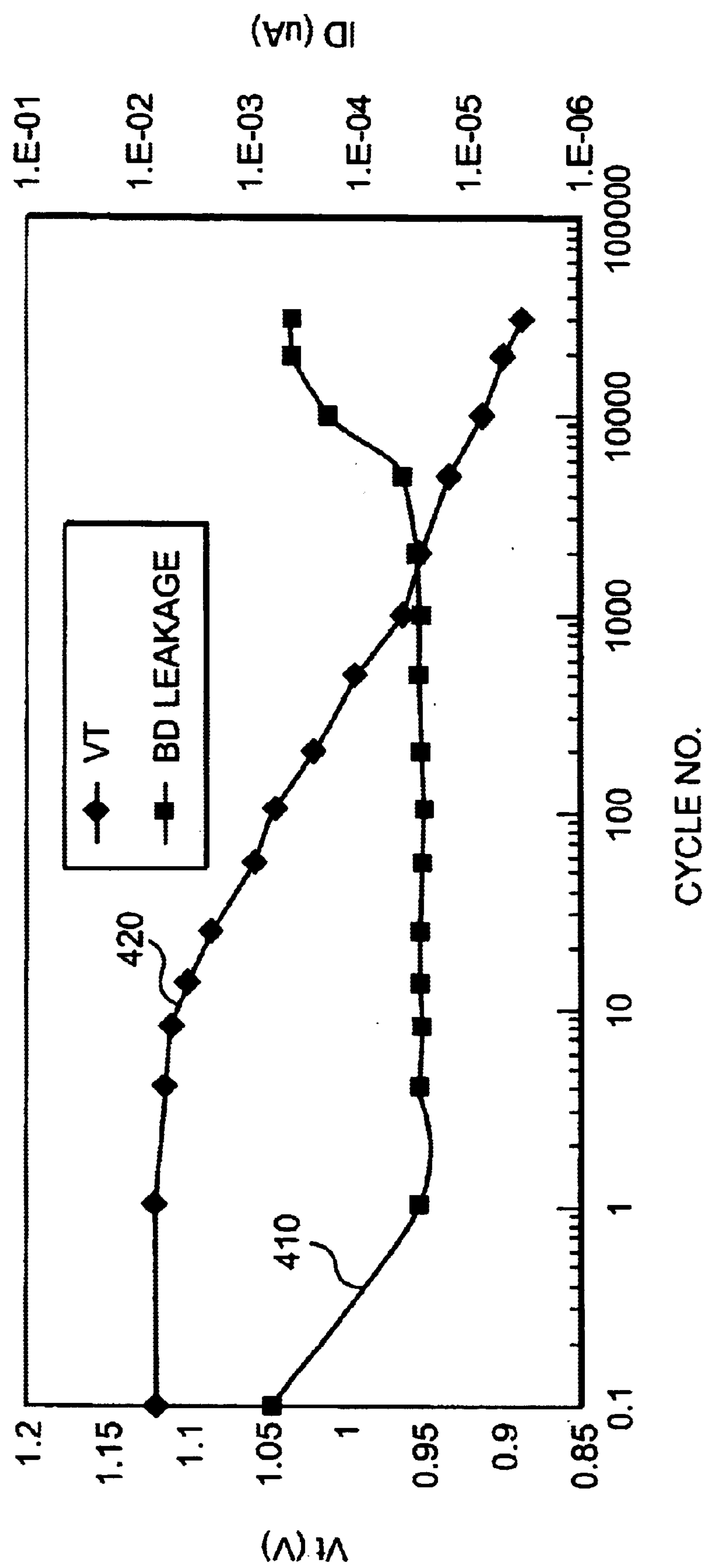
FIG. 4 is a graph demonstrating the current leakage and the threshold voltage of a dummy cell coupled to a dummy word line relative to the number of cycles in another embodiment consistent with the present invention.

Referring now to FIG. 4, there is shown a graph demonstrating the current leakage and the threshold voltage of a dummy cell coupled to a dummy word line relative to the number of cycles in a second embodiment consistent with the present invention. In this embodiment, with reference to dummy word lines 250 and 255, positive biases 280 and 285 supplied to dummy word lines 250 and 255, respectively, are set to approximately 0 volts during program operation and at 3.7 volts during erase operations. During program operation, the drain voltage applied to the bit line is set to approximately 7 volts, the source voltage is set to approximately 0 volts, the substrate voltage is set to approximately 0 volts, and the voltage is applied for roughly 2 μs. During erase operation, the drain voltage applied to the line is set to approximately 7.5 volts, the source voltage is allowed to float, the substrate voltage is set to approximately 0 volts, and the voltage is applied for roughly 40 ms.

Line 410 illustrates the change in BD leakage of dummy word line 250 over programming cycles. The BD leakage is initially 0.000621 μA. After 30,000 programming cycles, current BD leakage is 0.000409 μA, that is, the BD leakage drops by 0.000212 μA, rather than an increase of about 0.28 μA as in the prior art. Line 420 illustrates a change in threshold voltage. An initial threshold voltage of dummy cell $\mathbf{270}_j$ coupled to dummy word line 250 (shown in FIG. 2) is 1.121 volts. After 30,000 programming cycles, the threshold voltage is reduced to 0.8883 volts, or a drop of 0.2327 volts, rather than a decrease of about 0.21 volts as in the prior art.

Further, if semiconductor memory device 200 is baked for 4 hours at 150° C. to test for leakage, the BD leakage is further reduced to 0.0000322 μA, that is, it drops by 0.000588 μA, rather than an increase of about 0.47 μA as in the prior art, and the threshold voltage is further reduced to 0.758 volts, or a drop of 0.363 volts, rather than a drop of 0.398 volts as in the prior art.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor memory device, comprising:

a memory cell;

a dummy word line arranged at an edge of a memory array coupled to the memory cell;

a control logic for supplying a positive bias to the dummy word line during an erase operation; and at least one bit line coupled to the memory cell.

2. The semiconductor memory device of claim 1, further comprising a column decoder coupled to drive the at least one bit line.

3. The semiconductor memory device of claim 1, further comprising a sense amplifier coupled to the at least one bit line.

4. The semiconductor memory device of claim 1, further comprising at least one word line coupled to another memory cell, wherein the at least one word line is arranged perpendicular to the at least one bit line.

5. The semiconductor memory device of claim 4, further comprising a row decoder coupled to the at least one word for driving the at least one word line.

6. The semiconductor memory device of claim 1, wherein the control logic continuously supplies the positive bias to the dummy word line.

7. A semiconductor memory array, comprising:

a memory cell;

at least one bit line arranged in a first direction and coupled to the memory cell; and at least one dummy word line arranged at an edge of a memory array arranged in a second direction perpendicular to the at least one bit line and coupled to the memory cell, wherein a positive bias is selectively supplied to the at least one dummy word line at least during erase operation.

8. The semiconductor memory array of claim 7, wherein the at least one bit line is coupled to a column decoder.

9. The semiconductor memory array of claim 7, further comprising at least one word line arranged the second direction and coupled to another memory cell.

10. The semiconductor memory array of claim 9, wherein the at least one word line is coupled to a row decoder.

11. A method of forming a semiconductor memory device, comprising:

coupling a bit line to a memory cell;

providing a dummy word line at an edge of a memory array;

coupling the dummy word line to the memory cell; and supplying a positive bias to the dummy word line.

12. The method of claim 11, further comprising coupling the bit line to another memory cell and a second word line to the another memory cell.

13. The method of claim 12, further comprising applying a first voltage to the bit line and a second voltage to the second word line.

14. The method of claim 13, wherein the first voltage is greater than the second voltage.

15. The method of claim 13, wherein the first voltage is less than the second voltage.

16. The method of claim 11, wherein the positive bias is continuously supplied.

17. The method of claim 11, wherein the positive bias is greater than zero volts during programming operations.

* * * * *